United States Patent [19]

Codama et al.

[11] Patent Number: 5,470,762
[45] Date of Patent: Nov. 28, 1995

[54] METHOD OF FABRICATING A THIN FILM TRANSISTOR

[75] Inventors: Mitsufumi Codama; Noriaki Kondo, both of Kanagawa, Japan

[73] Assignee: Semiconductor Energy Laboratory Co., Ltd., Kanagawa, Japan

[21] Appl. No.: 979,261

[22] Filed: Nov. 20, 1992

[30] Foreign Application Priority Data

Nov. 29, 1991 [JP] Japan .................. 3-340338

[51] Int. Cl.⁶ .................. H01L 21/00; H01L 21/336; H01L 21/302
[52] U.S. Cl. .................. 437/21; 437/228; 437/233; 437/909
[58] Field of Search .................. 437/21, 909, 228, 437/233; 156/649

[56] References Cited

U.S. PATENT DOCUMENTS

| | | | |
|---|---|---|---|
| 4,070,211 | 1/1978 | Harari | 156/649 |
| 4,142,926 | 3/1979 | Morgan | 437/228 |
| 4,242,156 | 12/1980 | Peel | 437/228 |
| 4,277,884 | 7/1981 | Hsu | 156/649 |
| 4,335,504 | 6/1982 | Lee | 437/21 |
| 4,373,255 | 2/1983 | Gorankin | 437/21 |
| 4,385,937 | 5/1983 | Ohmura | 437/21 |
| 4,393,572 | 7/1983 | Policastro et al. | 437/21 |
| 5,153,142 | 10/1992 | Hsieh | 437/21 |
| 5,225,356 | 7/1993 | Omura et al. | 437/21 |
| 5,314,841 | 5/1994 | Brady et al. | 437/21 |

FOREIGN PATENT DOCUMENTS

| | | | |
|---|---|---|---|
| 0480803 | 4/1992 | European Pat. Off. | 156/649 |
| 53-26584 | 3/1978 | Japan | 437/21 |
| 55-68651 | 5/1980 | Japan | 437/21 |
| 55-75238 | 6/1980 | Japan | 437/21 |
| 58-25266 | 2/1983 | Japan | 437/21 |
| 58-56467 | 4/1983 | Japan | 437/21 |
| 60-225478 | 11/1985 | Japan | 437/909 |
| 62-61360 | 3/1987 | Japan | 156/649 |
| 1-241859 | 9/1989 | Japan | 437/21 |
| 2052853 | 1/1981 | United Kingdom | 437/21 |

*Primary Examiner*—Mary Wilczewski
*Attorney, Agent, or Firm*—Sixbey, Friedman, Leedom & Ferguson; Gerald J. Ferguson, Jr.; Eric J. Robinson

[57] ABSTRACT

A thin film transistor and a producing method therefor having a semiconductor layer which is formed in an islandish form and constitutes a channel forming region, a source region and a drain region, wherein the edge portion of the islandish semiconductor layer is so designed as to be gradually or monotonously thinned toward the edge thereof to prevent the gate insulating film covering the active layer from being thinned at the edge portion of the semiconductor layer. The gate insulating film is also smoothly formed to prevent an electric field concentration phenomenon at the edge portion.

13 Claims, 16 Drawing Sheets

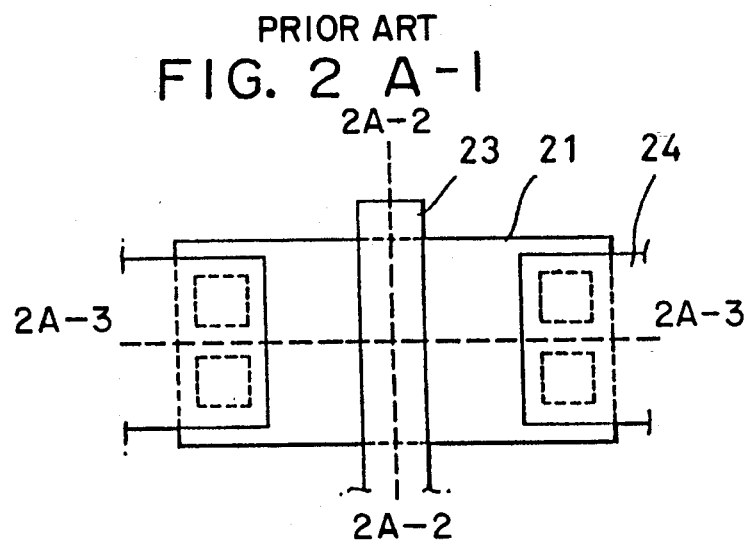
PRIOR ART
FIG. 2 A-1
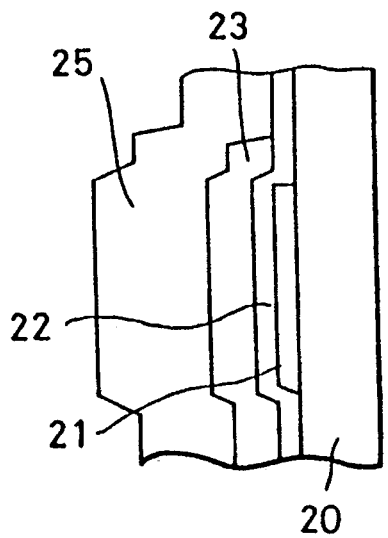
PRIOR ART
FIG. 2 A-2
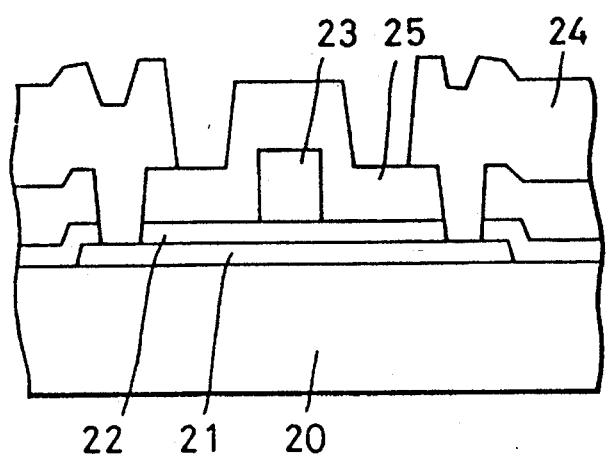
PRIOR ART
FIG. 2 A-3
FIG. 2 B  PRIOR ART
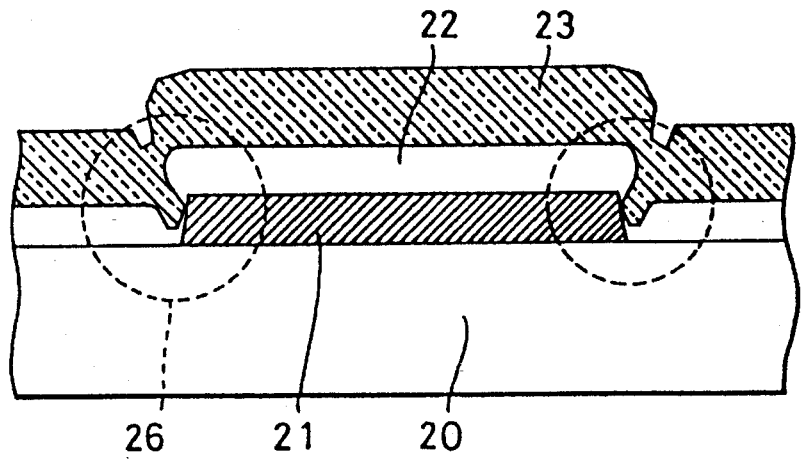

30  31  32

METHOD OF FABRICATING A THIN FILM TRANSISTOR

BACKGROUND OF THE INVENTION

1. Field of the Invention

This invention relates to a silicon thin film transistor which is mainly used in an active-matrix driving type of liquid crystal display, an image sensor, a thermal head, etc., and a method for forming the same.

2. Description of Related Art

A silicon thin film transistor (hereinafter referred to as "TFT") has been conventionally used in a liquid crystal display for a compact liquid crystal television and a computer, or an image sensor and a thermal head which are used in a facsimile, etc. A method for producing a conventional coplanar type of crystal silicon TFT will be hereunder described. First, an amorphous silicon layer is formed on an insulating substrate such as a glass substrate or the like, and then subjected to a heat annealing treatment at 550° C. to 800° C. or a laser irradiation to crystallize the amoriohous silicon layer. Subsequently, the crystallized silicon layer is subjected to a photolithographic process to be formed in an islandish shape. The islandish silicon layer serves as a channel forming region and source/drain region. In addition, a silicon oxide layer serving as a gate oxide layer is further formed on the islandish silicon layer by a sputtering method, a CVD method or the like. Subsequently, a gate electrode layer is formed, then a patterning process is conducted, then an impurity doping is conducted by an ion implantation method to make the source/drain regions one conductive type, and then the impurity is activated. Finally, a hydrogen heat treatment, formation of interlayer insulating films, formation of contact holes, and then formation of aluminum electrodes are performed to complete the coplanar type TFT.

The conventional coplanar type TFT thus formed has the structure as shown in FIG. 2A-1 to 2A-3. In FIG. 2A-1, a cross-sectional view of the structure is shown in FIG. 2A-1 which is taken along a line 2A-3—2A-3 shown in FIG. 2A-3, and a cross-sectional view or the structure which is taken along a line 2A-2—2A-2 is shown in FIG. 2A-2.

In FIG. 2A-2–2A-3, a reference numeral 20 represents a glass substrate, a reference numeral 21 represents a crystal silicon layer constituting the channel forming region and the source/drain region, a reference numeral 22 represents a silicon oxide layer serving as a gate insulating film, a reference numeral 23 represents a gate electrode, a reference numeral represents aluminum wiring for a source/drain electrode, and a reference numeral 25 represents an interlayer insulating film. As not shown, a silicon oxide film is coated as a protection film on the glass substrate to prevent diffusion of the impurities from the glass substrate.

In a TFT using crystal silicon, the crystal silicon layer which serves as an active layer constituting the channel forming region and the source/drain region is formed by crystallizing an amorphous silicon layer through heating. It has been known that the crystal silicon has more excellent crystallinity and more excellent electrical characteristics as the thickness of the amorphous silicon layer serving as starting material in thicker. However, if the thickness of the silicon semiconductor layer (hereinafter referred to as "active layer") constituting the channel forming region and the source/drain region which is shaped in a islandish form as described above is increased, a large step portion is formed at the edge portion of the islandish active layer Therefore, when the silicon oxide film layer serving as the gate insulating film is formed on the silicon active layer, the thickness of the silicon oxide layer at the side surface of the step portion becomes thinner. This is schematically shown in FIG. 2(B). FIG. 2(B) corresponds to the cross-sectional view of FIG. 2A-1 which is taken along the line. In FIG. 2(B), the interlayer insulating film 25 of FIG. 2A-2 is not shown.

Generally, the sputtering method has been frequently used to form the silicon oxide film layer. However, when the sputtering method is used, in the islandish active layer 21 having a steeply rising-up edge portion as shown in FIG. 2 (B), particularly, the thickness of the insulating film layer at the side surface thereof becomes thinner as indicated by a dotted circle 26 of FIG. 2 (B) because the step coverage of the insulating film layer at the side surface of the islandish active layer 21 is insufficient. Particularly when the thickness of the active layer 21 is increased, the insulating film layer at the side surface of the edge portion of the active layer is remarkably thin. Therefore, the conventional TFT has disadvantages that the active layer 21 and the gate electrode 23 are liable to be short-circuited because the insulating film layer is cut off at the step portion thereof, and that even if the insulating film layer is not cut off at the step portion, an electric field is concentrated on the insulating film layer at the corners of the edge portion of the active layer, so that the voltage resistance (dielectric strength) between the gate electrode and the source/drain electrode is reduced.

These disadvantages have mainly caused the lowering of yield and degradation in quality particularly for an active type of liquid crystal display device, an image sensor, etc. which require a number of TFTs to be provided on the glass substrate.

As one method of solving the above problem, there is proposed a method that the thickness of the silicon oxide film at the edge portion of the active layer is practically sufficiently increased by thickening the silicon oxide film layer serving as the gate oxide film. However, the thickening of the gate oxide film affects the electrical characteristics of the TFT, and thus the thickness of the gate oxide film can not be increased limitlessly. On the other hand, there is another method that the gate insulating film is formed by a film forming method providing excellent step coverage to solve the above problem in thickness of the insulating film layer at the side surface of the edge portion of the active layer. As this type of method have been known a photo-CVD method, a heat-CVD method and so on, however, the photo-CVD has a problem in producibility and the heat-CVD method has a problem that a low-cost glass substrate can not be used because this method requires a temperature condition above 650° C.

SUMMARY OF THE INVENTION

An object of this invention is to provide a TFT which can be produced without unpractical photo-CVD method, heat-CVD method or the like and which is practically usable with high reliability and solves the problems of a conventional TFT.

In order to attain the above object, according to one aspect of this invention, a thin film transistor includes an islandish active layer formed of a semiconductor layer which constitutes a channel forming region, a source region and a drain region, wherein the active layer is designed in such a tapered structure that the thickness of the edge portion (side portion) of the islandish semiconductor layer is gradually or monotonously decreased toward an end of the side portion, and in addition of or independently of the tapered structure, a portion of an insulating layer which covers the edge portion (side portion) of the active layer is substantially designed so as to be thicker than the other portion of the insulating layer which covers the other portion of the active layer. For example, the insulating layer is provided on the islandish semiconductor layer and thickness of the insulating layer is substantially larger on the side portion of the islandish semiconductor layer than on the channel forming region.

In the TFT thus constructed, the islandish active layer constituting the channel region, the source region and the drain region is formed of crystal silicon, however, may be formed of another crystal semiconductor having another crystal structure.

The structure that the edge portion of the islandish active layer is designed so as to be gradually more thinned toward the edge of the islandish active layer is equivalent to the structure that the active layer is smoothly tapered at the edge portion thereof. With this tapered structure, the insulating layer covering the edge portion of the active layer is also smoothly tapered.

In a conventional TFT, the insulating layer covering the active layer has a steep roughness as indicated by the reference numeral 22 of FIG. 2(B), and thus the effect of electrically protecting the active layer is more depressed particularly at the edge portion. On the other hand, in the TFT of this invention, as described above, the smoothly tapered portion is formed at the edge portion of the TFT, and thus the insulating layer having moderate roughness can be formed at the edge portion, so that the conventional problem ocurring at the edge portion of the active layer can be solved.

According to another aspect of this invention, the following method for forming the TFT having the structure as described above is also provided. That is, the method comprises the steps of providing a first layer mainly containing material having high etching rate on a semiconductor layer, forming a mask on the first layer to form a predetermined pattern, selectively etching the first layer by an isotropic etching with the predetermined pattern as a mask to perform a side etching, and etching the semiconductor layer by an anisotropic etching with the predetermined pattern of the mask, wherein the anisotropy of the anisotropic etching is so weakened that the semiconductor layer below the mask is gradually more thinned from the edge portion thereof.

Plainly describing the construction of this invention, the structure that the edge portion of the islandish active layer is gradually more thinned toward the edge thereof corresponds to a first main constructive element, and the structure that the insulating film layer specially covering the edge portion of the islandish active layer is provided corresponds to a second main constructive element.

In the construction of this invention, no restriction is imposed on the kind and crystal state of the semiconductor layer constituting the active layer. In addition, the type and structure of the TFT is not limited to the following embodiment. This is because the subject matter of this invention resides in the solving the problem which is caused by the occurrence of a step portion at the edge portion of the semiconductor layer.

Figure 3:
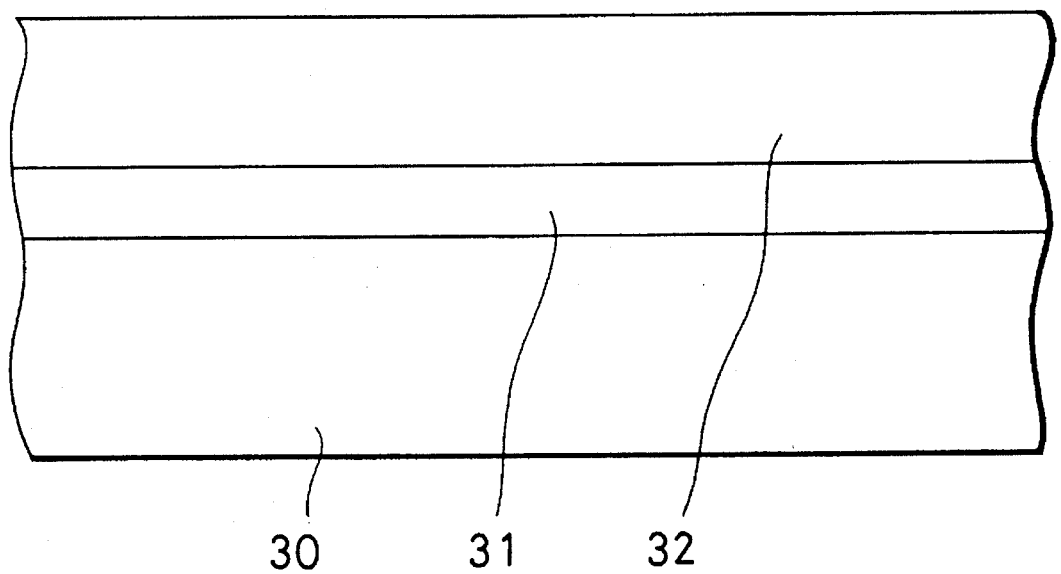
Figure 4:
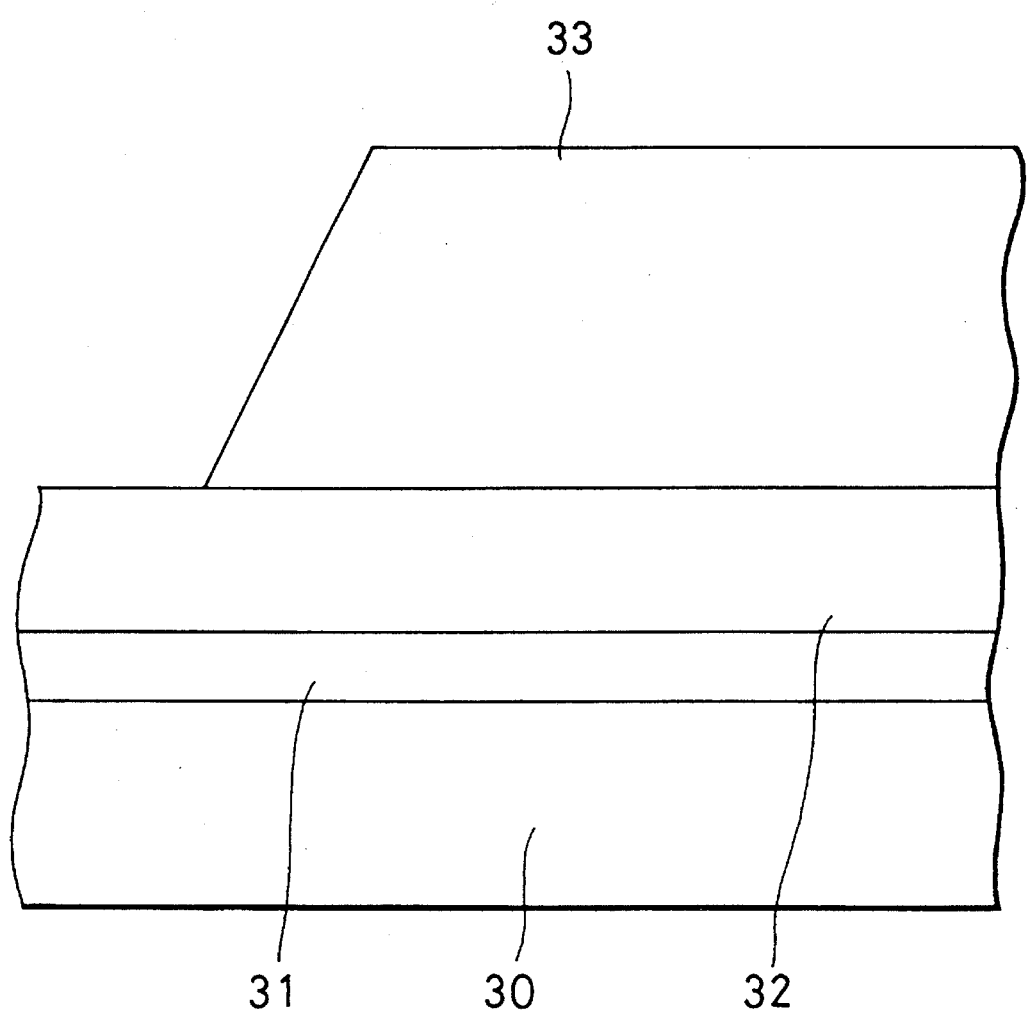
Figure 5:
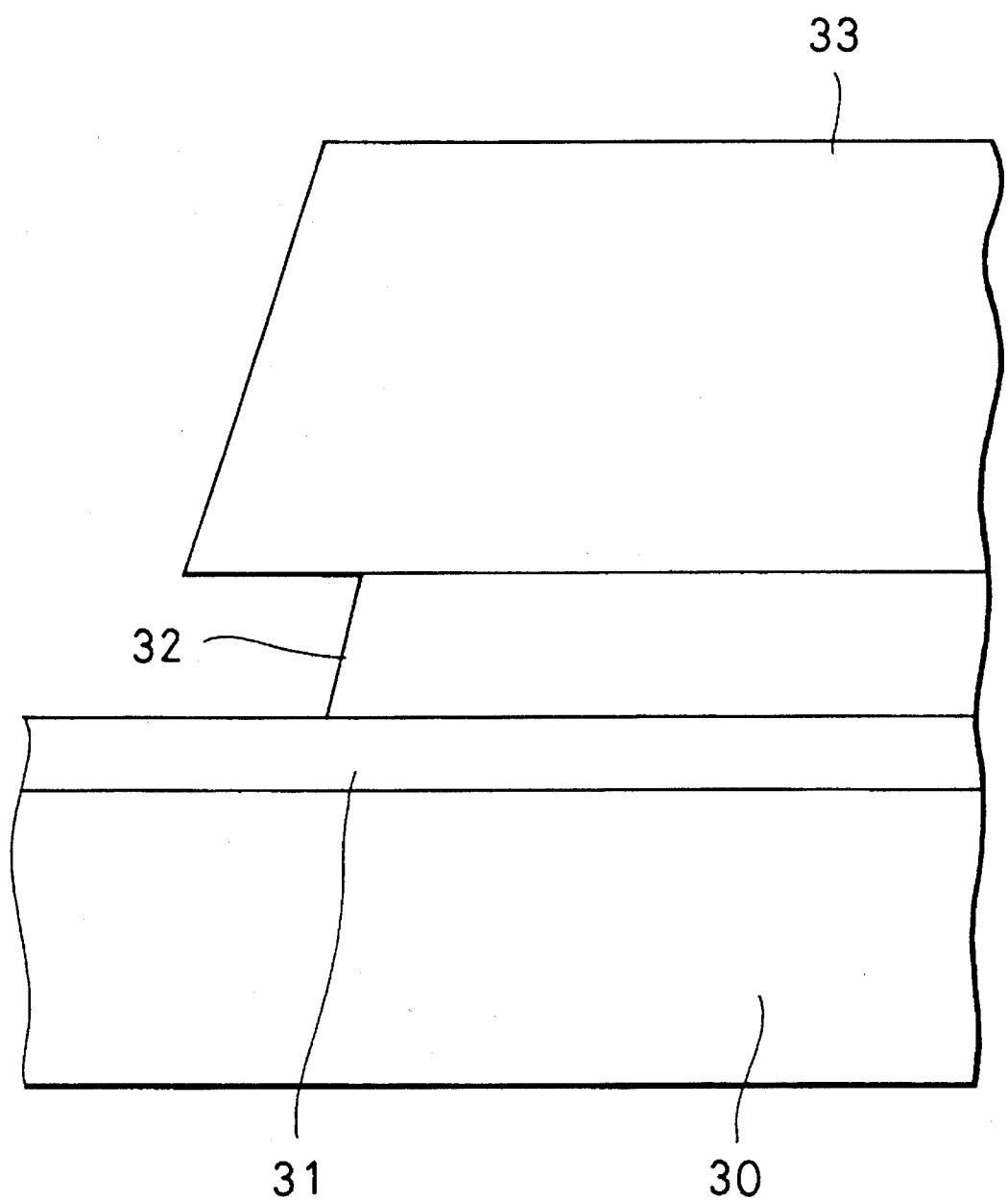
Figure 6:
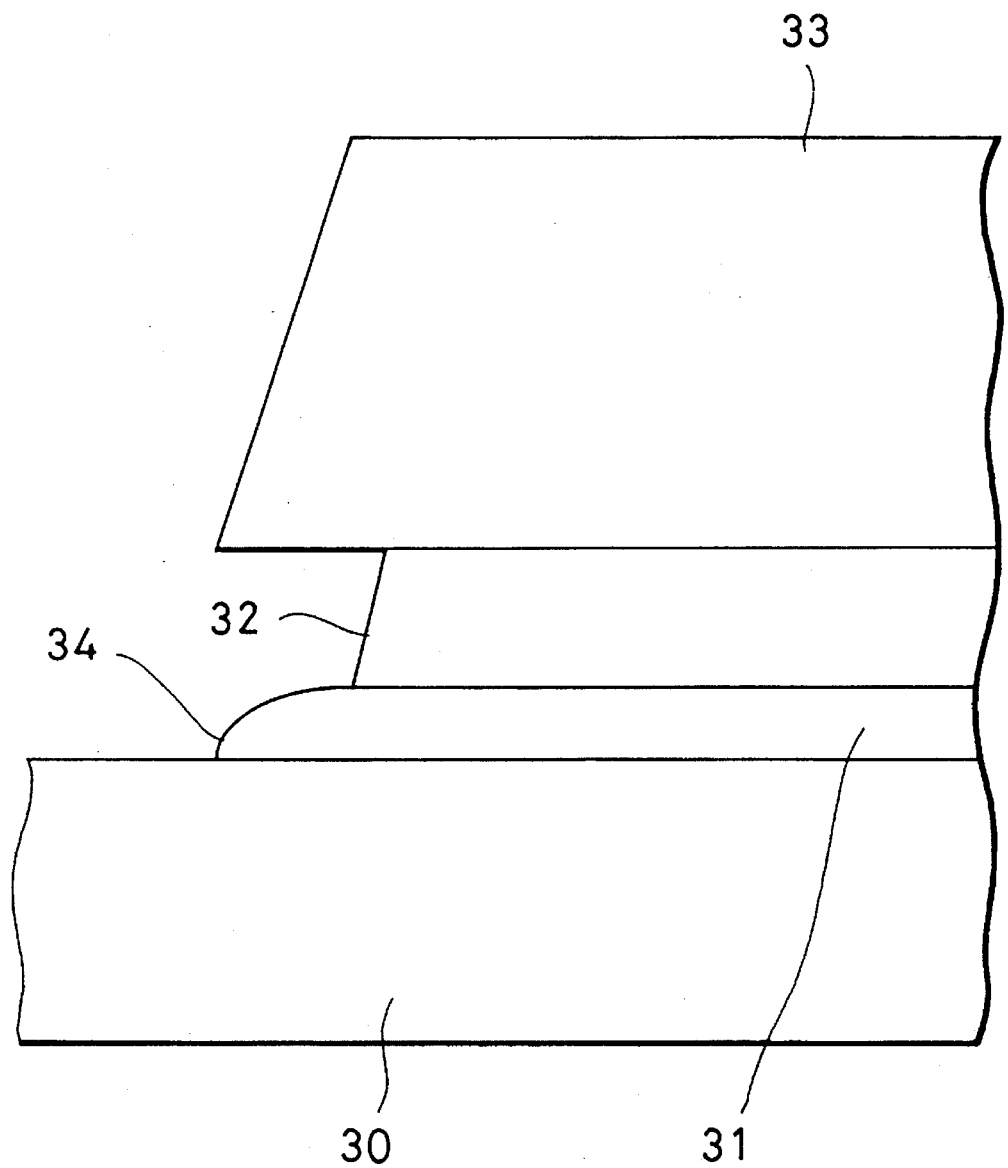
Figure 7:
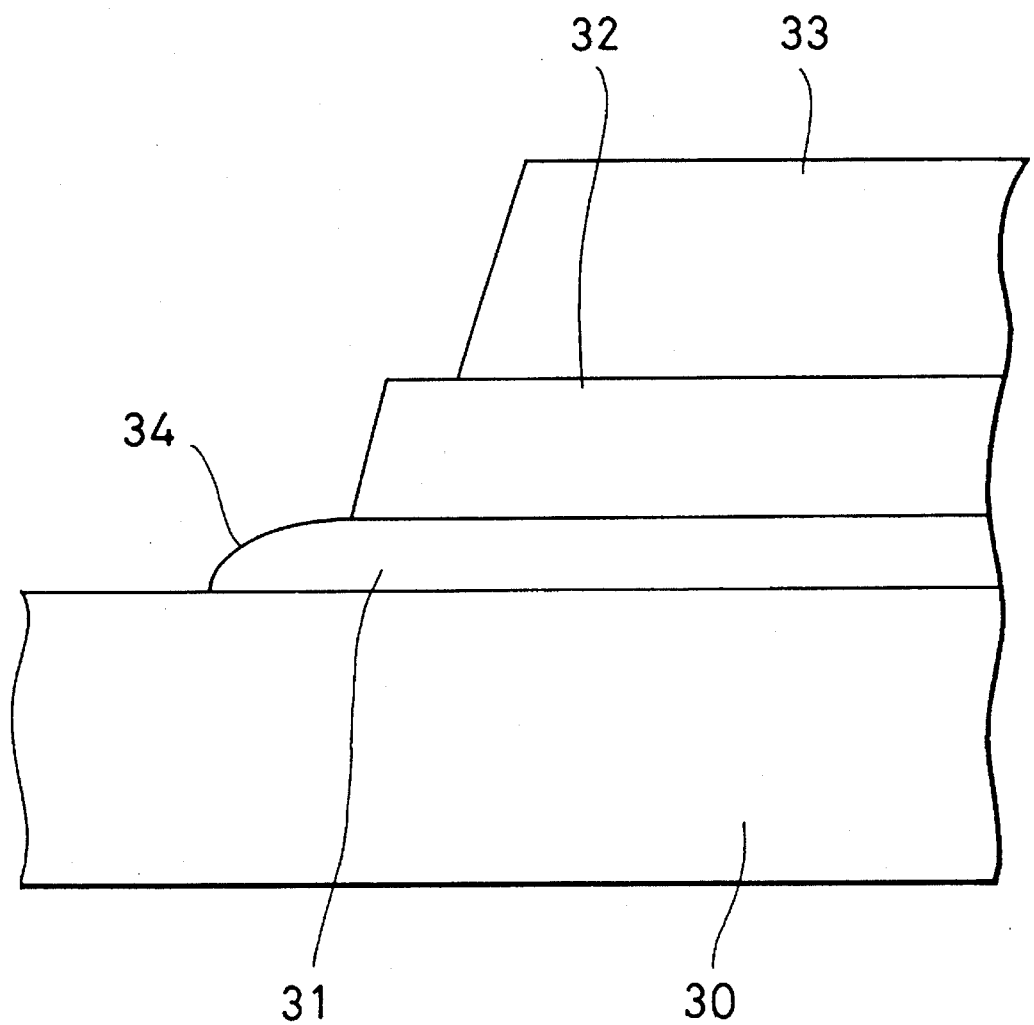
Figure 8:
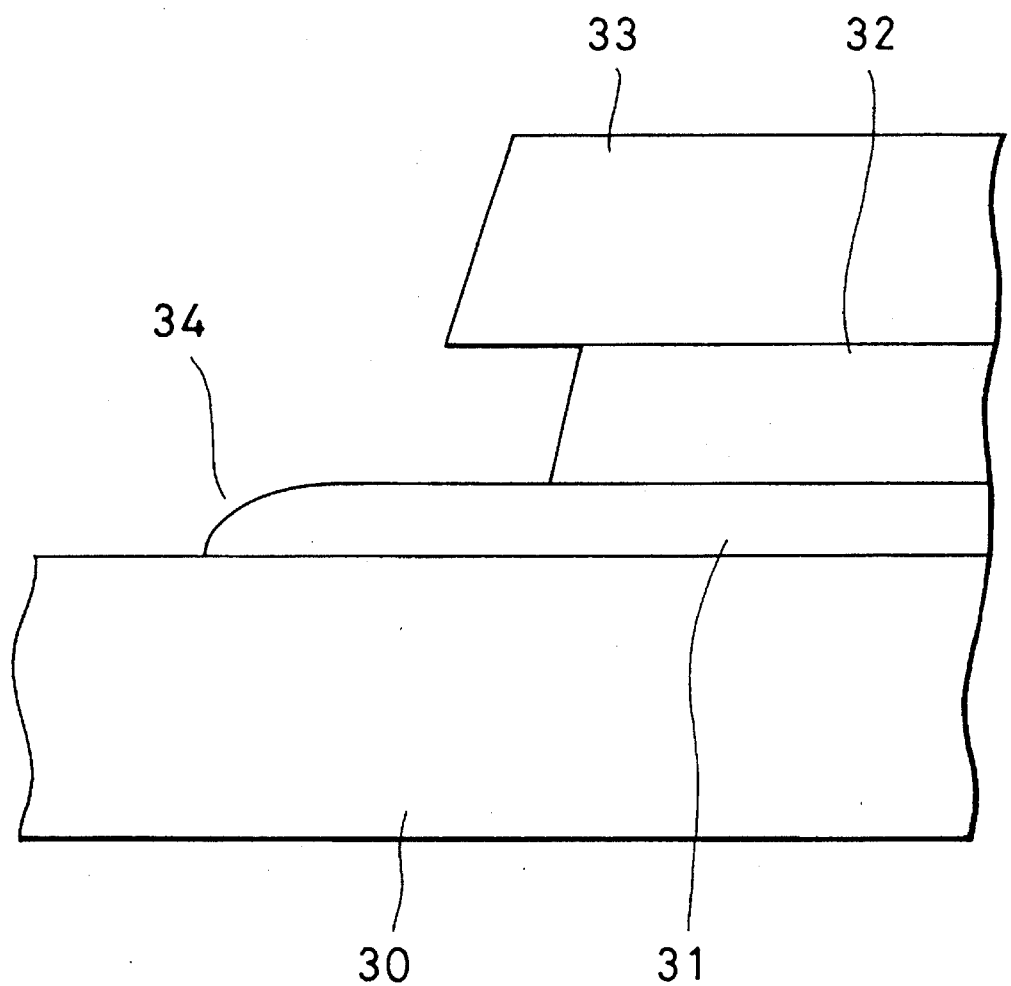
Figure 9:
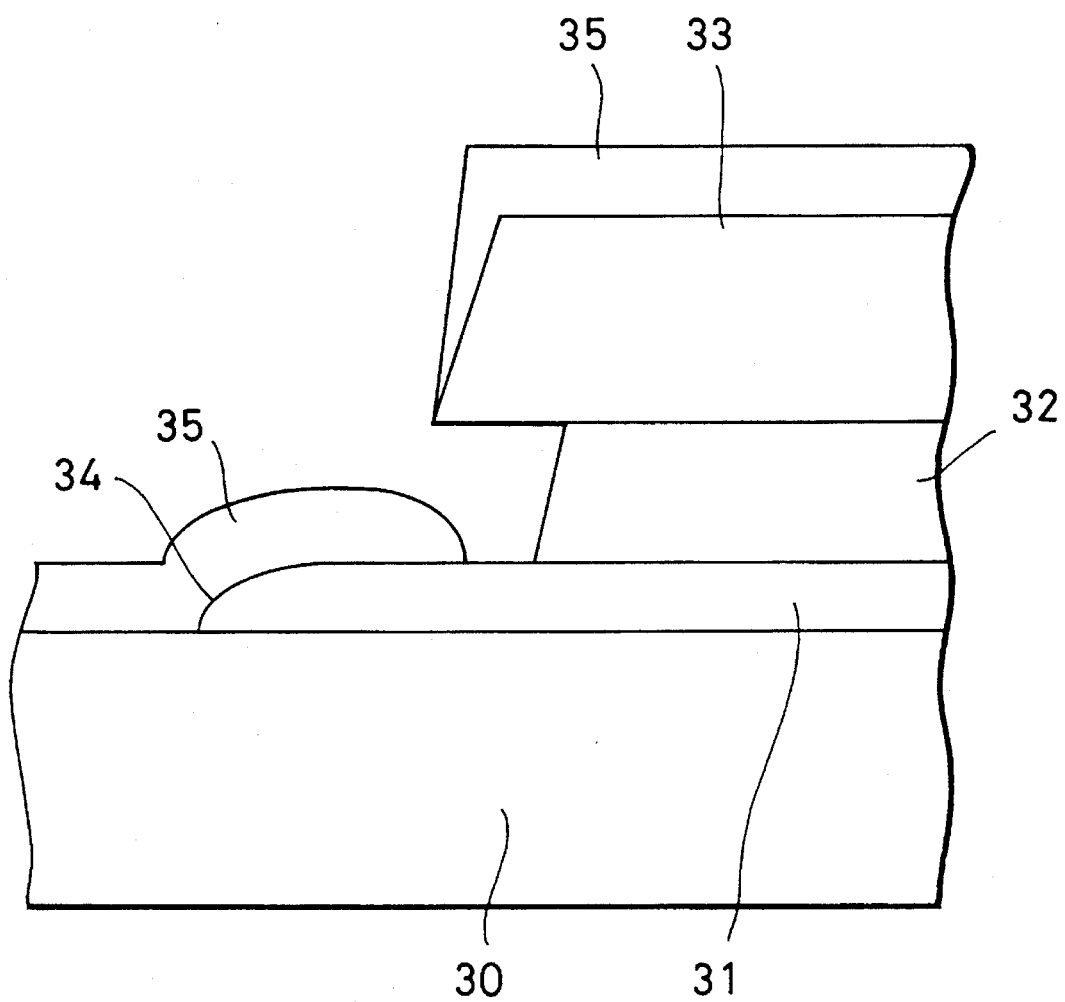
Figure 10:
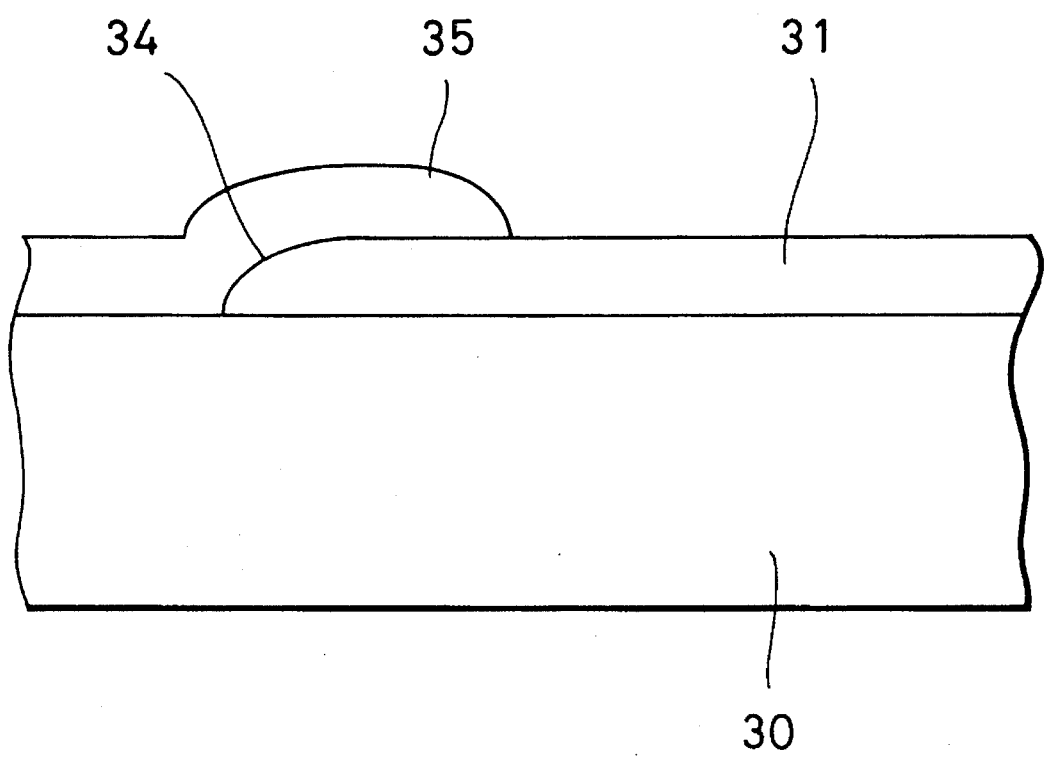
Figure 11:
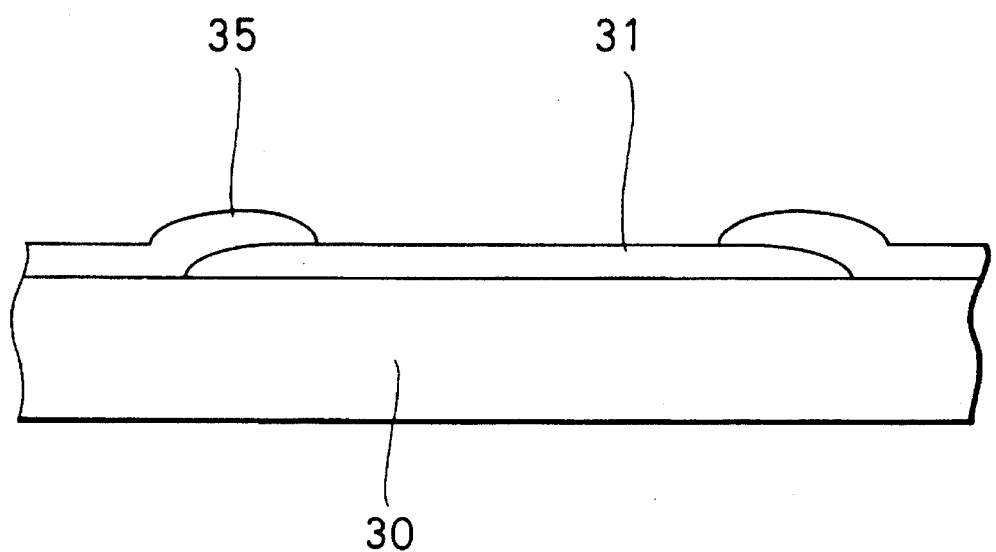
Figure 12:
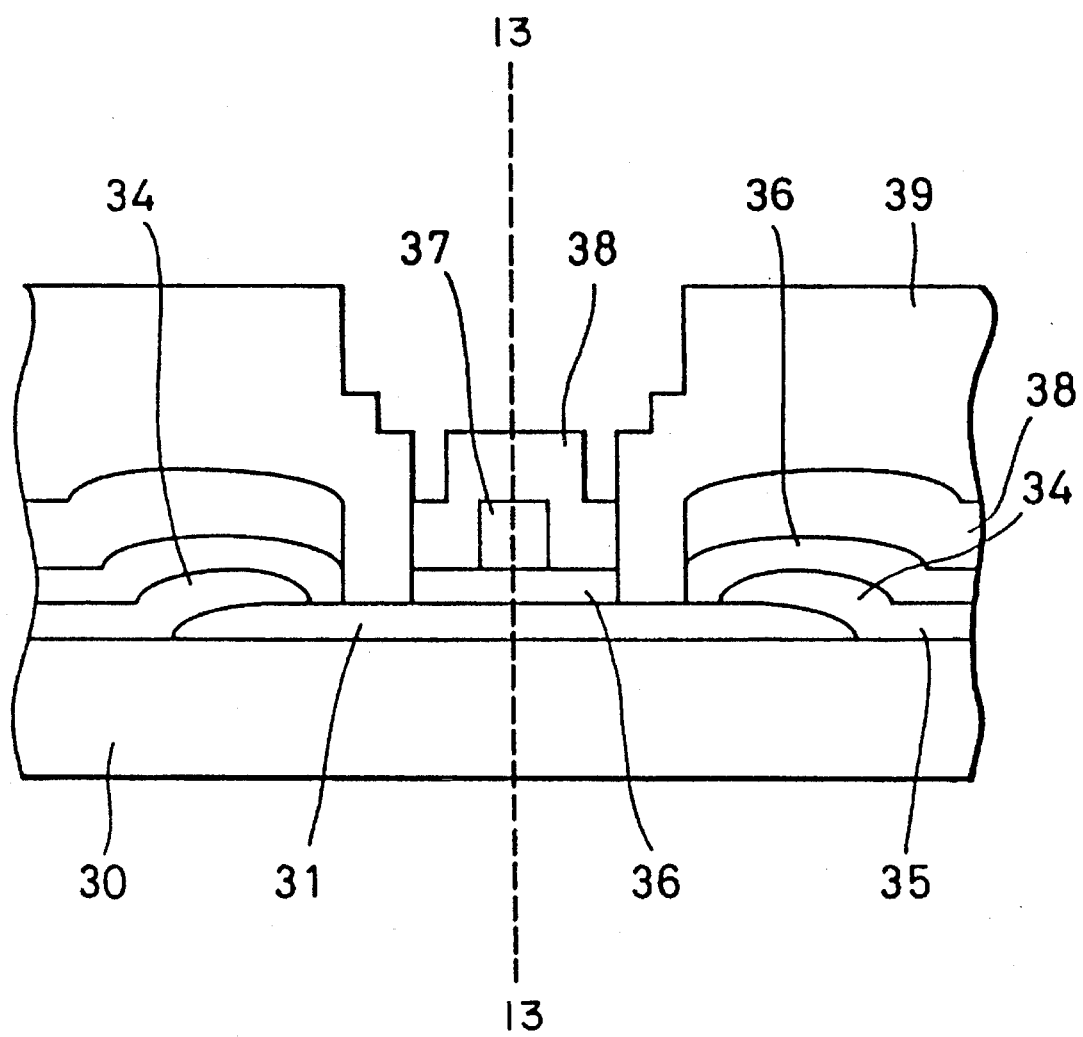
Figure 13:
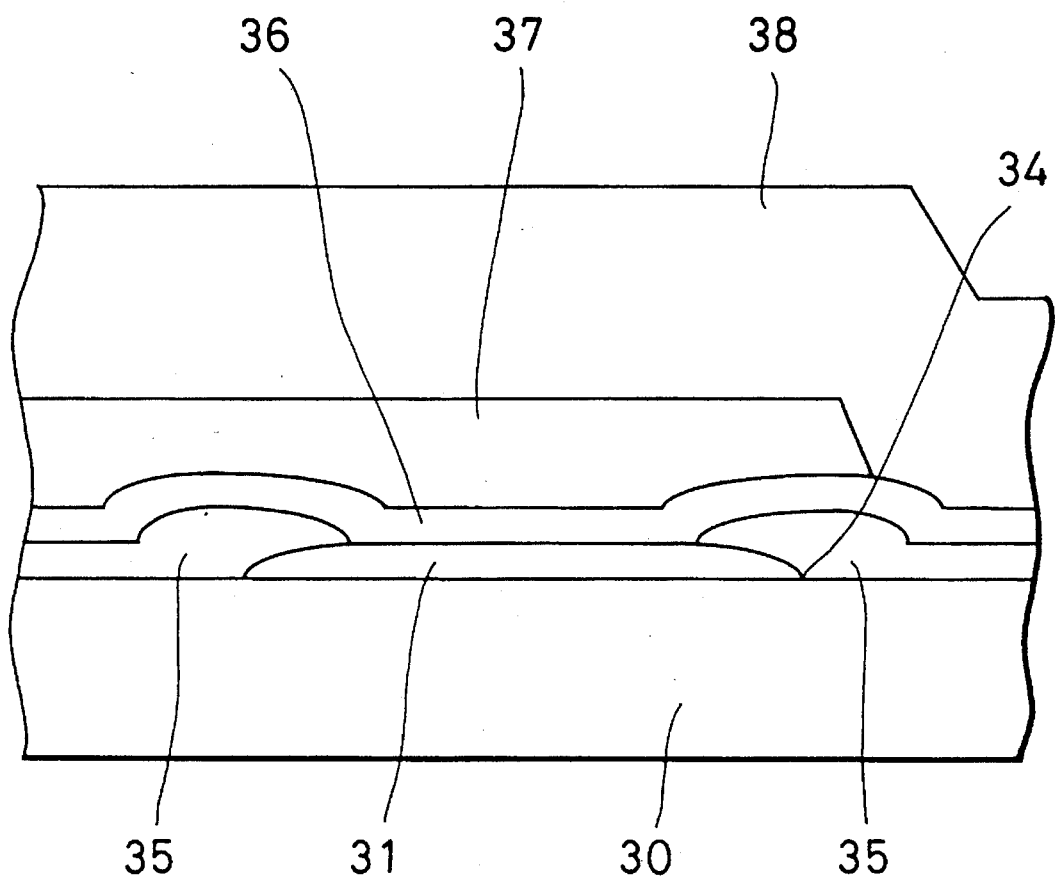
Figure 14:
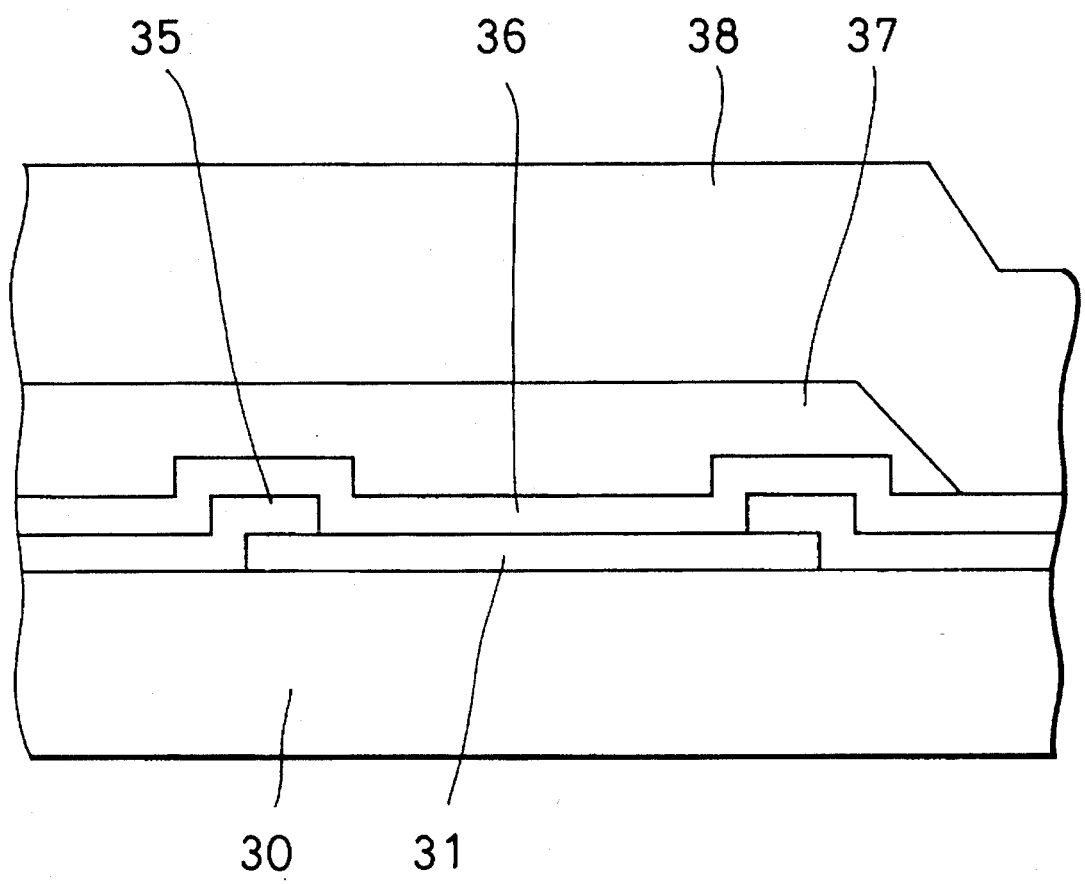
Figure 15:
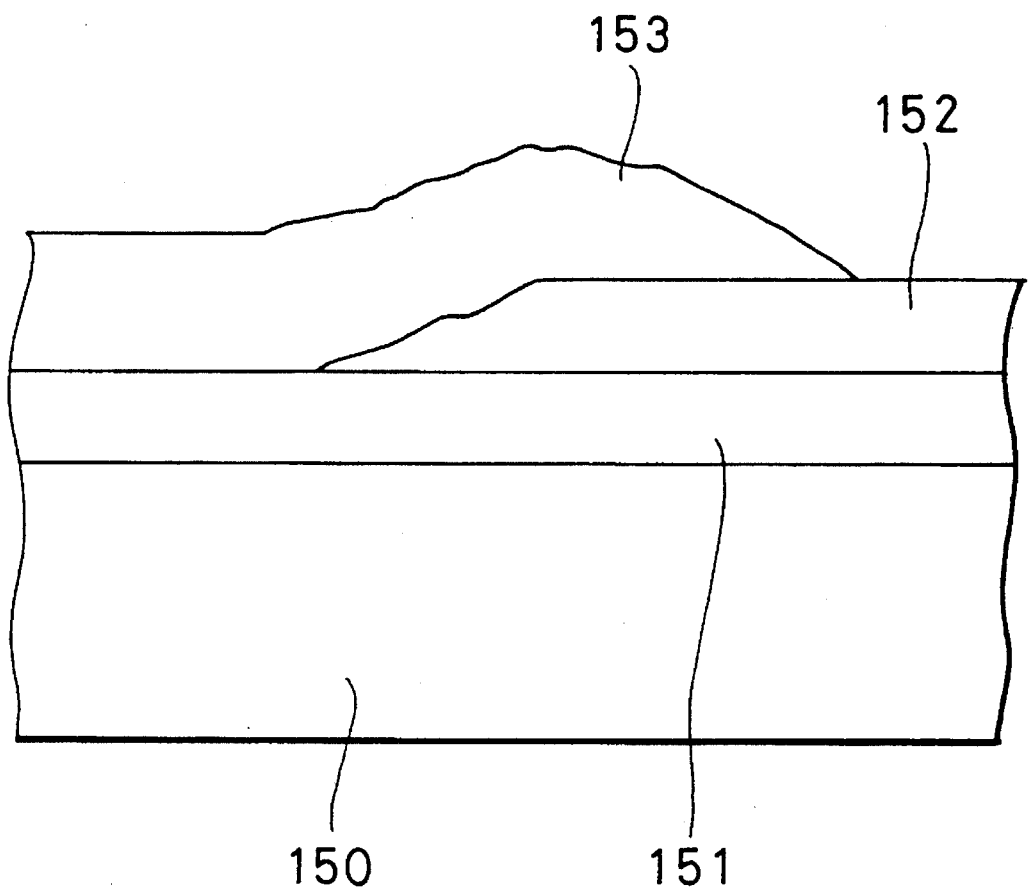
Figure 16:
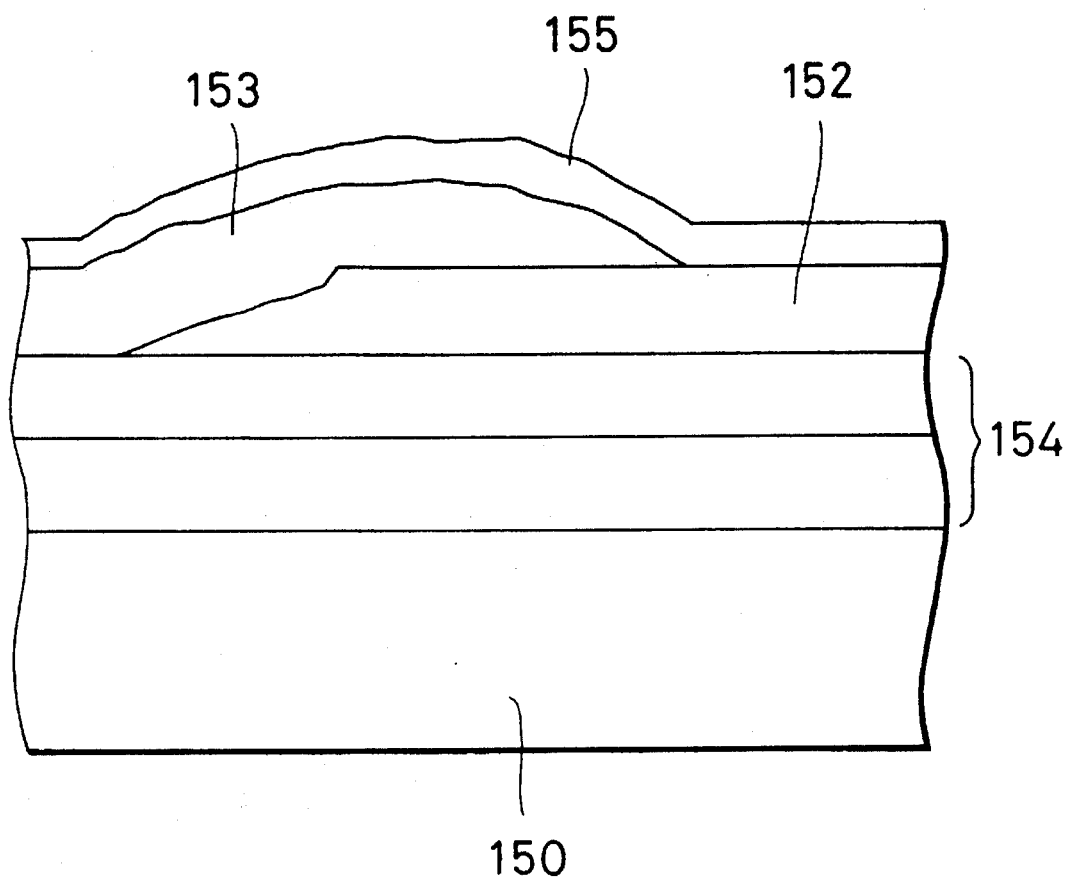

FIGS, 2 (A) and 2 (B) shows a conventional TFT;

FIG. 3 shows one step of a producing method of the TFT of this invention;

FIG. 4 shows another step of the producing method of this invention;

FIG. 5 shows another step of the producing method of this invention;

FIG. 6 shows anon;her step of the producing method of this invention;

FIG. 7 shows another step of the producing method of this invention;

FIG. 8 shows another step of the producing method of this invention;

FIG. 9 shows another step of the producing method of this invention;

FIG. 10 shows another step of the producing method of this invention;

FIG. 11 shows another step of the producing method of this invention;

FIG. 12 shows the TFT of the embodiment;

FIG. 13 shows the TFT of the embodiment;

FIG. 14 shows the TFT of the embodiment;

FIG. 15 is a schematic diagram of a sectional SEM photograph of the TFT of the embodiment; and FIG. 16 is a schematic diagram of a sectional SEM photograph of the TFT of the embodiment.

DETAILED DESCRIPTION OF THE INVENTION

Preferred embodiments of this invention will be hereunder described with reference to the accompanying drawings.

First Embodiment

A TFT (thin film transistor) of this embodiment is characterized by including a crystal silicon semiconductor layer which is formed in an islandish shape and serves as an active layer constituting a channel forming region, a source region and a drain region, wherein thickness of the edge portion (side portion) of the islandish semiconductor layer is gradually or monotonously decreased toward an end of the side portion of the islandish semiconductor layer, and an insulating layer covering the edge portion (side portion) of the semiconductor layer is provided independently of a gate insulating film to design the insulating layer covering the edge portion of the active layer to be substantially thicker than the insulating layer covering the other portion of the active layer.

A method for producing the TFT having the above structure comprises the steps of providing a first layer mainly containing material having high etching rate on a semiconductor layer, forming a mask on the first layer to form a predetermined pattern, selectively etching the first layer to perform a side etching, and etching the semiconductor layer by an anisotropic etching, wherein the anisotropy of the anisotropic etching is weakened that the semiconductor layer below the mask is gradually more thinned toward the edge portion thereof.

In this embodiment, a silicon oxide film is used for the insulating layer covering the active layer as described above, and an SOG film is used for the first layer having high etching rate.

The process for producing the TFT of this embodiment is shown in FIG. 3 and the subsequent figures.

In this embodiment, a glass substrate is used for a substrate, and of converse, another insulating substrate or a semiconductor substrate may be used. Further, in this embodiment, the glass substrate is coated with silicon oxide film as a protection film. Hereinafter, the glass substrate and the silicon oxide film are described as being integrally formed into one body. Accordingly, as not shown in the figures, the silicon oxide film is formed on the glass substrate.

First, as shown in FIG. 3, an amorphous silicon semiconductor film 31 serving as a TFT active layer was formed in 1500 Å thickness on the glass substrate 30. No restriction is imposed on the thickness of the amorphous silicon semiconductor film 31. However, the construction of this invention provides a remarkable effect that the amorphous silicon semiconductor film 31 may be sufficiently thickened, and this provides an effective affection on a subsequent crystallizing process.

The film formation of the semiconductor layer may be performed by any well-known method, however, this embodiment adopted the heat-CVD method under the following condition.

| Reaction gas | disilane |
| Film forming temperature | 480° C. |
| Film forming pressure | 0.4 Torr |

The film forming speed is preferably as high as possible, and in this embodiment the film formation was carried out at a film forming speed above 80 Å/min.

After the amorphous silicon semiconductor film 31 was formed, a heat annealing treatment was conducted to convert the amorphous silicon semiconductor to a crystal silicon semiconductor. The heat annealing treatment is generally conducted under a heat annealing condition at temperature of 550° C. to 800° C. for 6 to 72 hours, and in this embodiment, the heat annealing treatment was conducted at 600° C. for 48 hours in consideration of the heat resistance of the glass substrate to obtain crystal silicon.

Of course, the crystallization of the amorphous silicon semiconductor may be performed by irradiating an excimer laser or the like thereto. Subsequently, SOG (spin-on-glass) having etching rate 100 or more times as large as that of the silicon semiconductor film 31 was formed in 5000 Å thickness to form a film 32. The film 32 of SOG is used to selectively etch only the film 32 utilizing the high etching rate thereof in the isotropic etching treatment to induce a side etching, so that only the SOG film is allowed to be selectively etched from the sides.

The SOG film was formed by spin-coating silica solution and then sintering the silica with heat. The silica solution was applied to the semiconductor film 31 by the spin-coating and solidified by the sintering. SOG was used because the rigidity of silica is variable by controlling its sintering temperature, and thus the etching rate is variable without changing the etching condition. Through the above process, an intermediate member comprising the glass substrate 30, the crystal silicon layer 31 and the SOG film 32 as shown in FIG. 3 was obtained.

Thereafter, a resist 33 was coated on the intermediate member thus obtained by a well-known method to form a predetermined mask pattern on the intermediate member. No restriction is imposed on the kind of the resist, and in this embodiment the patterning was conducted using a positive type of resist by a well-known method. FIG. 4 shows a part of the resist pattern thus formed. The portion as shown in FIG. 4 corresponds to the edge portion of an active layer which will be formed in an islandish shape.

After the formation of the resist mask pattern, a wet etching serving as an isotropic etching was conducted. Here, only the SOG film 32 was selectively etched utilizing the etching rate of the SOG film 32 to perform a side etching as shown in FIG. 5. The etching operation acted on the whole portions of all layers which were exposed to the outside, but only the SOG film 32 was selectively etched as shown in FIG. 5 because the SOG film 32 was particularly liable to be more rapidly etched, so that a so-called side-etched structure (side-etched space) was obtained, that is, a side recess is formed under the resist mask pattern on the semiconductor film 31. The side etching distance was set to about 10000 Å. The isotropic etching was conducted using an etching solution comprising mixture of commercially-sold HF solution and $NH_4F$ in ratio of 1:20 through the wet etching.

The intermediate member as shown in FIG. 5 was subsequently subjected to an anisotropic etching to etch the silicon semiconductor layer 31. In this embodiment, anisotropy of the anisotropic etching is weak sufficiently to etch the semiconductor film under the :side recess (the side-etched space) to taper the side portion of the islandish semiconductor layer. That is, in this embodiment, in a state where the anisotropy of the anisotropic etching was weakened, an etching gas was allowed to be invaded onto a surface portion of the crystal silicon semiconductor layer 31 which was covered by the resist pattern as shown in FIG. 5, that is, a recess portion which had been obtained by the side-etching of the SOG film 32 in the previous process, thereby etching the crystal silicon semiconductor layer 31. In this case, the etching of the crystal silicon semiconductor layer 31 more rapidly propagates as it approaches to the edge of the resist 33. Therefore, the etching of the crystal semiconductor layer 31 is conducted in such a manner that the edge portion of the crystal silicon semiconductor layer 31 has a profile as shown in FIG. 6. That is, by the anisotropic etching, a semiconductor island is left with a side portion of said semiconductor island being tapered so that thickness of said side portion of said semiconductor island is monotonously decreased toward an end of said side portion of said semiconductor island.

Through the above process, one of the constructive elements of this invention, that is, the structure that the edge portion of the islandish active layer of crystal silicon semiconductor layer is gradually more thinned toward the edge 34 thereof to finally obtain the crystal silicon semiconductor layer having a gently-sloping edge portion was achieved.

Here, the most important point resides in the following point. When an islandish semiconductor layer having a gently-sloping edge portion is formed, a layer (layer 1) having material whose etching rate is higher than that of the semiconductor layer is provided on the semiconductor layer, then conducting the isotropic etching to intentionally conducting the side-etching on the layer 1, and then the semiconductor layer below the layer 1 is subjected to the anisotropic etching utilizing the side-etched space of the layer 1.

No restriction is imposed on the mode of the anisotropic etching which is used for the above process, and in this embodiment, a reactive ion etching mode was adopted using a dry etching device adopting a parallel flat plate type of RF discharge. In place of this mode, an ECR mode may be used.

The following is an etching condition for the anisotropic etching which was conducted in this embodiment.

| | |
|---|---|
| Etching gas | $CF_4:SF_3 = 20:1$ |
| Pressure | 0.05 Torr |
| RF power | 200 W |
| Self-bias applied to substrate | 100–150V |

The anisotropy of the anisotropic etching is controlled as follows.

In order to improve the anisotropy, (1) the pressure is reduced, (2) the self-bias is increased, or (3) the ratio of $SF_3$ to $CF_4$ is lowered.

In order to weak the anisotropy, (1) the pressure is heightened, (2) the self-bias is decreased, or (3) the ratio of $SF_3$ to $CF_4$ is heightened.

In order to form the islandish semiconductor layer having the structure that the edge portion thereof is gradually more thinned, that is, the TFT active layer having a gently-sloping edge portion, the formation process should be performed according to the above conditions. In this embodiment, the edge portion of the active layer which was formed according to the above conditions was further coated with an insulating film layer. This is why the thickness of the insulating layer covering the edge portion of the active layer is substantially thicker than that of the insulating layer covering the other portion of the active layer.

In order to achieve the above structure, after the intermediate member as shown in FIG. 8 was obtained, the resist was etched by a desired amount through an ashing to obtain an intermediate member as shown in FIG. 7. The ashing means a treatment for reducing the film to expose the edge portion of the active layer to the outside viewing from the upper surface of the substrate.

After the intermediate member as shown in FIG. 7 was obtained, the wet etching was conducted under the same condition as described above to subjecting the SOG film layer 32 to the side etching again. The side etching was conducted to obtain a side etching distance of about 10000 Å to form an intermediate member as shown in FIG. 8.

Thereafter, a silicon oxide film (insulator) 35 was formed on the side portion of the islandish semiconductor layer in 2000 Å thickness as an insulating film layer for protecting the edge portion 34 of the active layer by the sputtering method to form an intermediate member as shown in FIG. 9. As shown in FIG. 9, the silicon oxide film (insulator) 35 has a smooth surface on the side portion of the islandish semiconductor layer. The silicon oxide film was formed by the RF sputtering method under the following film forming condition.

| | |
|---|---|
| Gas | Oxygen + Argon = 8:2 |
| Pressure | 0.5 Pa |
| RF power | 400 W |
| Substrate Temperature | 150° C. |

Subsequently, the resist layer 33 was removed to conduct a lift-off, so that the silicon oxide film 35 formed on the resist layer 33 and its neighborhood was removed, and then the SOG film layer 32 was removed to obtain a structure that the edge portion 34 of the active layer was covered by the insulating film layer 35 as shown in FIG. 10. Thereafter, a gate insulating film was formed on the insulating film layer 35 and the islandish semiconductor layer and in contact with the channel forming region, and then a well known process was conducted to complete the TFT.

The important point of the above process resides in the point that the insulating film layer can be selectively formed on the edge portion of the active layer. Through this construction, the insulating layer covering the edge portion of the active layer can be designed so as to be substantially thicker than that covering the other portion of the active layer, that is, that on the channel forming region, and thus the edge portion of the active layer can be protected with the simple construction. Further, since the edge portion of the active layer is so designed as to be smoothly tapered as shown in FIG. 10, the insulating film layer 35 covering the edge portion is also formed in a smoothly-tapered shape. Even though such a construction is formed, a gate insulating film can be formed on the channel forming region in the same manner as the conventional TFT.

In this embodiment, the silicon oxide film was used as the insulating film layer, however another insulating film such as a nitride film or the like may be used.

FIG. 15 is a schematic diagram of a sectional SEM photograph corresponding to FIG. 10 for a sample formed in this embodiment. The elements of FIG. 15 correspond to a bed protection film layer 151 of silicon oxide film which is formed on the glass substrate 150, the active layer 152 of crystal silicon layer in 1500 Å thickness and the silicon oxide film layer 153 of 2000 Å which covers the edge portion of the active layer 152 and has a smoothly-tapered portion.

FIG. 16 shows the edge portion of the active layer of a sample different from the sample of FIG. 15. It is found out from FIG. 16 that the bed protection film 2 comprises two layers because the enlargement ratio of FIG. 16 is large, and the gate insulating film 155 is formed in 1000 Å thickness.

The following is also found out from FIG. 16. That is, one of the constructive elements of this invention, the structure that the edge portion of the islandish crystal silicon active layer is gradually more thinned, in other words, the islandish crystal silicon layer having a gently-sloping edge portion was obtained. In addition, it is found that the obtained insulating layer is not cut out and extremely thin at the step portion of the edge portion of the active layer.

FIG. 11 shows the whole construction of FIG. 10. As is apparent from FIG. 11, the edge portion of the active layer 31 is gradually more thinned toward the edge thereof. In addition, the silicon oxide film layer 35 having a gently tapered portion is provided so as to cover the edge portion. In this case, since no silicon oxide film layer 35 is provided on the surface of the active layer serving is the channel forming region, the gate insulating film can be formed in the same manner as the prior art.

It is also important that the whole surroundings of the edge portion of the active layer 31 are formed in the manner as shown in FIG. 11, so that the edge portion of the active layer is smoothly formed and covered by the silicon oxide film layer, even viewing from any cross section thereof. Subsequently, the active layer 31 is subjected to a well-known process to form regions of a source/drain region and a channel region therein and complete a TFT. In this embodiment, an N-channel type TFT (N-channel insulated gate field effect transistor, hereinafter referred to as "NTFT") was formed by the following method.

After the intermediate member as shown in FIG. 11 was obtained, the silicon oxide film layer serving as the gate insulating film was formed in 1000 Å thickness by the RF sputtering method. The film forming condition was as follows.

| | |
|---|---|
| Gas | oxygen 100% |
| Pressure | 0.5 Pa |
| RF power | 400 W |
| Substrate Temperature | 150° C. |

Subsequently, a gate electrode 37 was formed as shown in FIG. 12. The gate electrode may be formed by a well-known method such as an LPCVD method, a plasma CVD method or the like, and no restriction is imposed on this invention. This embodiment used a gate electrode of crystal silicon which was doped with phosphorus, which is an element having a valency of 5 and provides N-type conductive characteristic to silicon.

Further, the ion implantation was conducted using phosphorus which was an element providing one conductive type (N-type in this case) to form the source/drain region, then the activation process was conducted, and then the source/drain region was finally formed. Subsequently, a silicon oxide film layer serving as the interlayer insulating film 38 was formed in 10000 Å thickness by the sputtering method, then patterning process for forming holes in the source/drain region was conducted, and then an aluminum layer serving as a source/drain electrode wiring 39 was formed. FIG. 13 is a cross-sectional view of FIG. 12 which is taken along a line C—C' and is viewed from the right side of the FIG. 12. In FIG. 13, the construction of the gate electrode wiring 37 is shown.

As described above, in the conventional TFT, the gate electrode 37 and the active layer are partitioned through only a gate insulating film at the edge portion of the active layer 31, and the active portion rises up steeply and vertically at the edge portion thereof, so that the thickness of the insulating layer serving as the gate insulating film at the side surface of the rise-up (step) portion is extremely thin. Therefore, the voltage resistance (dielectric strength) between the gate electrode and the source/drain electrode is degraded even though the insulating film is not cut off at the step portion, and this causes an unstable operation of the TFT.

However, in this embodiment, as shown in FIG. 13, the edge portion 34 of the active layer 31 is so designed as to be smoothly sloped, and also the silicon oxide film layer 35 is so provided as to cover the edge portion 34 as shown in FIGS. 12 and 13. Therefore, this embodiment has a remarkable effect that the problem of the conventional TFT can be completely solved. In addition, this embodiment has another effect that the construction for obtaining the above effect can be easily incorporated into the process of forming the conventional TFT as described in detail in the process of this embodiment.

In this embodiment, the N-channel type of TFT was formed. However, the TFT of this invention is not limited to the N-channel type, and may be a P-channel type of TFT. Further, no restriction is imposed on the detailed construction of the TFT insofar as the construction of the edge portion of the active layer and the producing method therefor are applicable thereto.

Second Embodiment

In the first embodiment, both of the structure that the edge portion of the active layer is gradually more thinned, that is, the edge portion of the active layer is smoothly or gently formed, and the structure that edge portion of the active layer thus formed is covered by the insulating film are adopted. However, a TFT can solve the problem of the prior art even though the TFT has only any one of the structures as described above.

In this embodiment, the structure that the edge portion of the active layer is smoothly formed, that is, the structure that the thickness of the edge portion of the active layer is gradually reduced toward the edge thereof is adopted. As described above, the conventional TFT has a problem that the gate electrode 23 and the edge portion of the active layer 21 are nearer approached to each other as shown in FIG. 2(B) at the edge portion of the active layer 21, and this invention has an object of solving this problem. Therefore, only the structure of the edge portion of the active layer as surrounded by the dotted line 26 of FIG. 2(B) may be improved to achieve the above object.

Accordingly, in this embodiment, by forming the edge portion of the active layer so that it is gently sloped (by gradually more thinning the edge portion of the active layer toward the edge thereof), the insulating film layer (generally, the gate insulating film) formed on the active layer is prevented from being thin on the side surface of the edge portion of the active layer.

Figure 1:
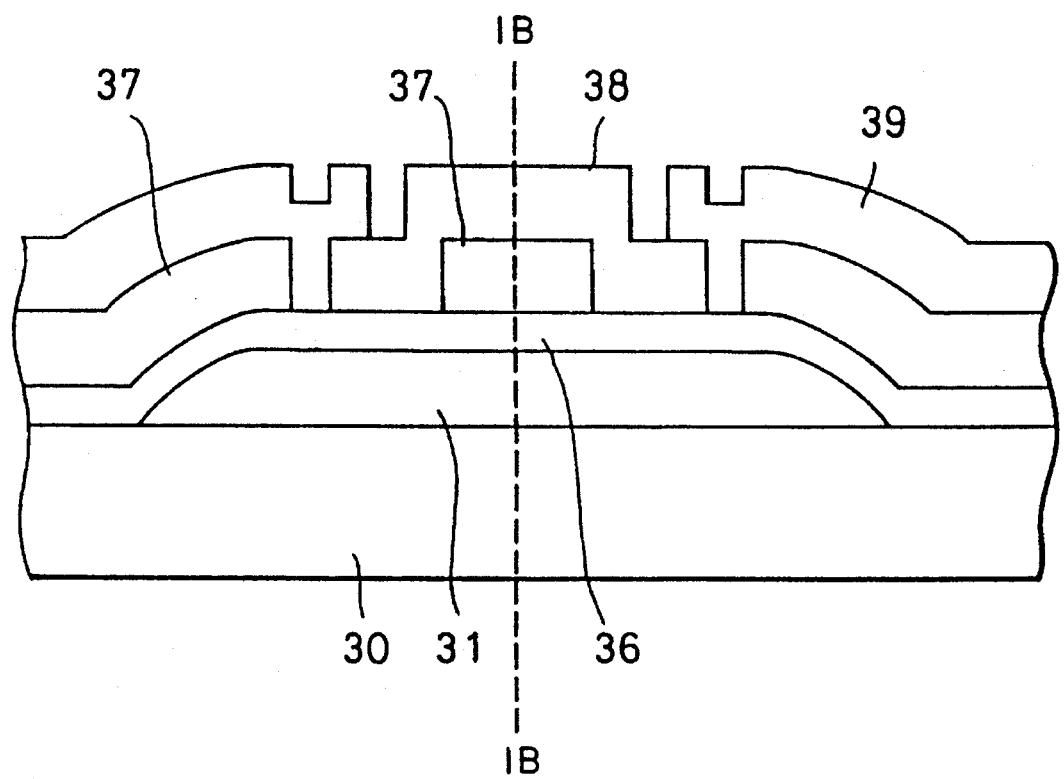
FIGS. 1(A) and 1(B) shows a TFT of an embodiment of this invention.
Figure 1:
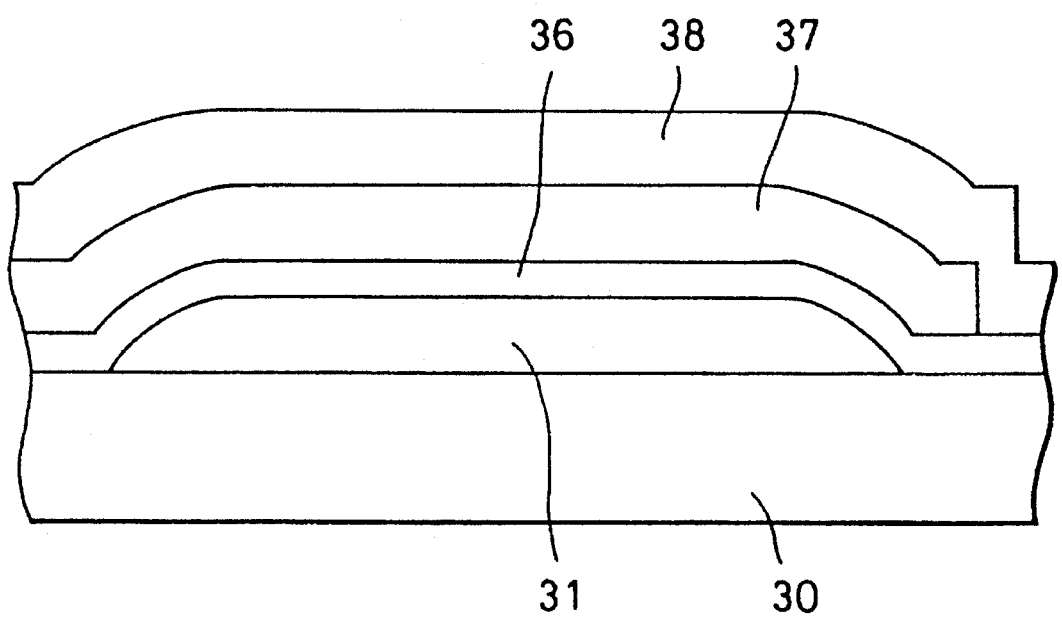

In this embodiment, the construction of the NTFT of the first embodiment is simplified, and the TFT of this embodiment can be formed by eliminating a part of the process of producing the NTFT of the first embodiment. In detail, after the intermediate member as shown in FIG. 7 is obtained in the process of the first embodiment, the resist 33 and the SOG film layer 32 are removed to form the active layer, and then the gate electrode, the gate insulating film, the source/drain region, the source/drain electrode, etc., are formed to obtain the NTFT. FIGS. 1 (A) and (B) show the NTFT produced by the method of this embodiment. The reference numerals of the respective elements of FIGS. 1 (A) and (B) are the same as those of the first embodiment. FIG. 1 (B) is a cross-sectional view which is taken along a line a—a' of FIG. 1 (A).

With the construction of this embodiment, the insulating film layer covering the edge portion of the active layer can be prevented from being thinner, and the problems of the prior art, that is, the cut-off of the insulating film layer at the step portion and the electric field concentration phenomenon at the portion where the insulating film layer is more thinned, can be solved, so that the stable operation and the high yield can be achieved.

The subject matter of this invention resides in that the edge portion of the active layer is smoothly or gently formed, and thus no restriction is imposed on the other processes and the construction of the other elements. Further, in this embodiment, the source/drain region is formed by the ion implantation and the source/drain region and the channel forming region are simultaneously formed in self-alignment. In a TFT having a channel region, a source region and a drain region which are formed of different semiconductor layers, failure of voltage resistance (dielectric strength) and reduction of reliability of the TFT can be effectively improved by applying to any one or a plurality of the above semiconductor layers the structure of this invention that the edge portion is smoothly or gently formed.

Third Embodiment

The TFT of this embodiment has the structure that the edge portion of the active layer 31 of the first embodiment is designed in a stepwise structure like the conventional TFT, and the insulating film layer as shown in FIG. 14 is provided so as to cover the stepwise edge portion of the active layer to thereby solve the problem of the conventional TFT. FIG. 14 corresponds to FIG. 13. The same reference numerals are used between FIG. 14 and FIG. 13, and only the shape of the edge portion of the active layer 31 is different between FIG.

13 and FIG. 14.

The TFT of this embodiment can be also obtained by altering a part of the producing process of the first embodiment. That is, the anisotropic etching for forming the intermediate member as shown in FIG. 6 is conducted while strengthening the anisotropy of the anisotropic etching, so that the etching gas does not invaded into a portion below the resist and an active layer having a stepwise edge portion is formed like the conventional TFT. Thereafter, the same process as the first embodiment is conducted to obtain the TFT.

In this embodiment, the edge portion of the active layer 31 can be also protected by covering the silicon oxide film 35 on the edge portion, and thus the disadvantage of the prior art can be overcome.

According to this invention, the edge portion of the active layer of the crystal silicon thin film transistor (TFT) is so designed as to be gradually more thinned toward the edge of the active layer, and further covered by the insulating film, so that the thickness of the insulating film at the edge portion of the active layer is substantially thicker than that covering the other portion of the active layer. Therefore, the cut-off of the gate insulating film at the step portion of the edge portion of the active layer can be prevented, and failure of voltage resistance (dielectric strength) and reduction of reliability of the TFT due to the thinning of the gate insulating film at the edge portion of the active layer can be improved.

What is claimed is:

1. A method for forming a thin film transistor comprising the steps of:

forming a first layer on a semiconductor layer;

forming a mask pattern on said first layer;

etching said first layer to form a side recess under said mask pattern on said semiconductor layer; and anisotropically etching said semiconductor layer with said mask pattern to leave a semiconductor island with a side portion of said semiconductor island being tapered so that thickness of said side portion of said semiconductor island is monotonously decreased toward an end of said side portion of said semiconductor island.

2. The method of claim 1 wherein anisotropy of said anisotropically etching is sufficiently weak to etch said semiconductor layer under said recess to obtain the tapered side portion.

3. The method of claim 1 wherein said first layer etching step is carried out by isotropic etching.

4. The method of claim 1 wherein etching rate of said first layer is 100 or more times as large as that of said semiconductor layer.

5. The method of claim 1 wherein said first layer comprises a spin on glass.

6. The method of claim 1 wherein the formation of said first layer is carried out by applying a silica solution to said semiconductor layer and subsequently solidifying said silica solution by heating.

7. The method of claim 1 wherein said first layer etching step is carried out with said mask pattern as a mask.

8. The method of claim 1 wherein said first layer etching step is carried out by wet etching.

9. The method of claim 8 wherein said wet etching is carried out by a mixed solution comprising HF and $NH_4F$.

10. The method of claim 1 wherein etching rate of said first layer is larger than that of said semiconductor layer.

11. The method of claim 1 wherein said anisotropically etching is carried out utilizing a bias.

12. A method for forming a thin film transistor comprising the steps of:

forming a semiconductor island comprising a channel forming region, a source region and a drain region therein;

forming a first insulator on a side portion of said semiconductor island; and forming a gate insulating film on said first insulator and said semiconductor island wherein said gate insulating film directly contacts said semiconductor island at said channel forming region and is formed to cover both said semiconductor island and said first insulator.

13. A method for forming a thin film transistor comprising the steps of:

forming on a semiconductor layer a first layer having an etching rate larger than that of said semiconductor layer;

forming a mask pattern on said first layer;

etching said first layer to form a side recess under said mask pattern on said semiconductor layer; and anisotropically etching said semiconductor layer with said mask pattern to leave a semiconductor island with a side portion of said semiconductor island being tapered so that thickness of said side portion of said semiconductor island is monotonously decreased toward an end of said side portion of said semiconductor island.

* * * * *